United States Patent
Lippincott

(10) Patent No.: US 7,327,289 B1
(45) Date of Patent: Feb. 5, 2008

(54) DATA-MODIFYING RUN LENGTH ENCODER TO AVOID DATA EXPANSION

(75) Inventor: Louis Lippincott, Los Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/533,647

(22) Filed: Sep. 20, 2006

(51) Int. Cl.
*H03M 7/46* (2006.01)
(52) U.S. Cl. .......................... 341/63; 341/60
(58) Field of Classification Search ............ 341/60–90
See application file for complete search history.

(56) References Cited

U.S. PATENT DOCUMENTS 6,947,604 B2 * 9/2005 Lippincott .................. 382/237
7,129,864 B2 * 10/2006 Jahanghir et al. ........... 341/106

* cited by examiner

*Primary Examiner*—Lam T. Mai
(74) *Attorney, Agent, or Firm*—Trop, Pruner & Hu, P.C.

(57) ABSTRACT

A method of selectively run length encoding data may include removing a trigger value from one or more data elements if the trigger value is present in the one or more data elements and calculating a run length of the one or more data elements. The method may also include encoding the one or more data elements as a command pair when the run length is greater than two. The command pair may include the trigger value. The one or more data elements may be output without encoding the one or more data elements when the run length is not greater than two.

20 Claims, 3 Drawing Sheets

DATA-MODIFYING RUN LENGTH ENCODER TO AVOID DATA EXPANSION

BACKGROUND

Implementations of the claimed invention generally may relate to schemes for data compression and, more particularly, to such schemes that involve run length encoding.

Run Length Encoding (RLE) has been used for data compression for many years. Because RLE use the repetition of data elements to compress the data, it works very well on images displayed on TVs and computers. For example, within a black and white graphical image, there may be significant repetition of pixels, especially the white pixels. Hence, for such an image, one may use RLE to compress the data in the frame buffer holding this image and reduce, for example, the memory size, power and/or bandwidth requirements of such a buffer.

One known design issue with RLE is that it is possible for the RLE process to expand the size or amount of data, instead of compress it. This issue arises in RLE by virtue of the observation that it takes more than one data element (e.g., at least a pair of data elements) to describe both 1) the data level or value and 2) it run length. This pair of data elements may sometimes be referred to as a "command pair." If too many changes occur within the data to be run length encoded, then it may take a greater number of data elements (e.g., command pairs) to describe the run-length and value pairs than the number of data elements originally contained in the data. Such a larger amount of data after RLE may be referred to as "data expansion."

Because of the possibility of this data expansion, system and circuit designers may typically design systems in view of the "worst case" amount of data expansion. Such design practices may reduce or eliminate the use of RLE, for some applications, because the "worst case" amount of data expansion may use more power, memory size and/or bandwidth than not employing RLE at all.

BRIEF DESCRIPTION OF THE DRAWINGS

The accompanying drawings, which are incorporated in and constitute a part of this specification, illustrate one or more implementations consistent with the principles of the invention and, together with the description, explain such implementations. The drawings are not necessarily to scale, the emphasis instead being placed upon illustrating the principles of the invention. In the drawings.

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of the claimed invention. However, it will be apparent to those skilled in the art having the benefit of the present disclosure that the various aspects of the invention claimed may be practiced in other examples that depart from these specific details. In certain instances, descriptions of well known devices, circuits, and methods are omitted so as not to obscure the description of the present invention with unnecessary detail.

Figure 1:
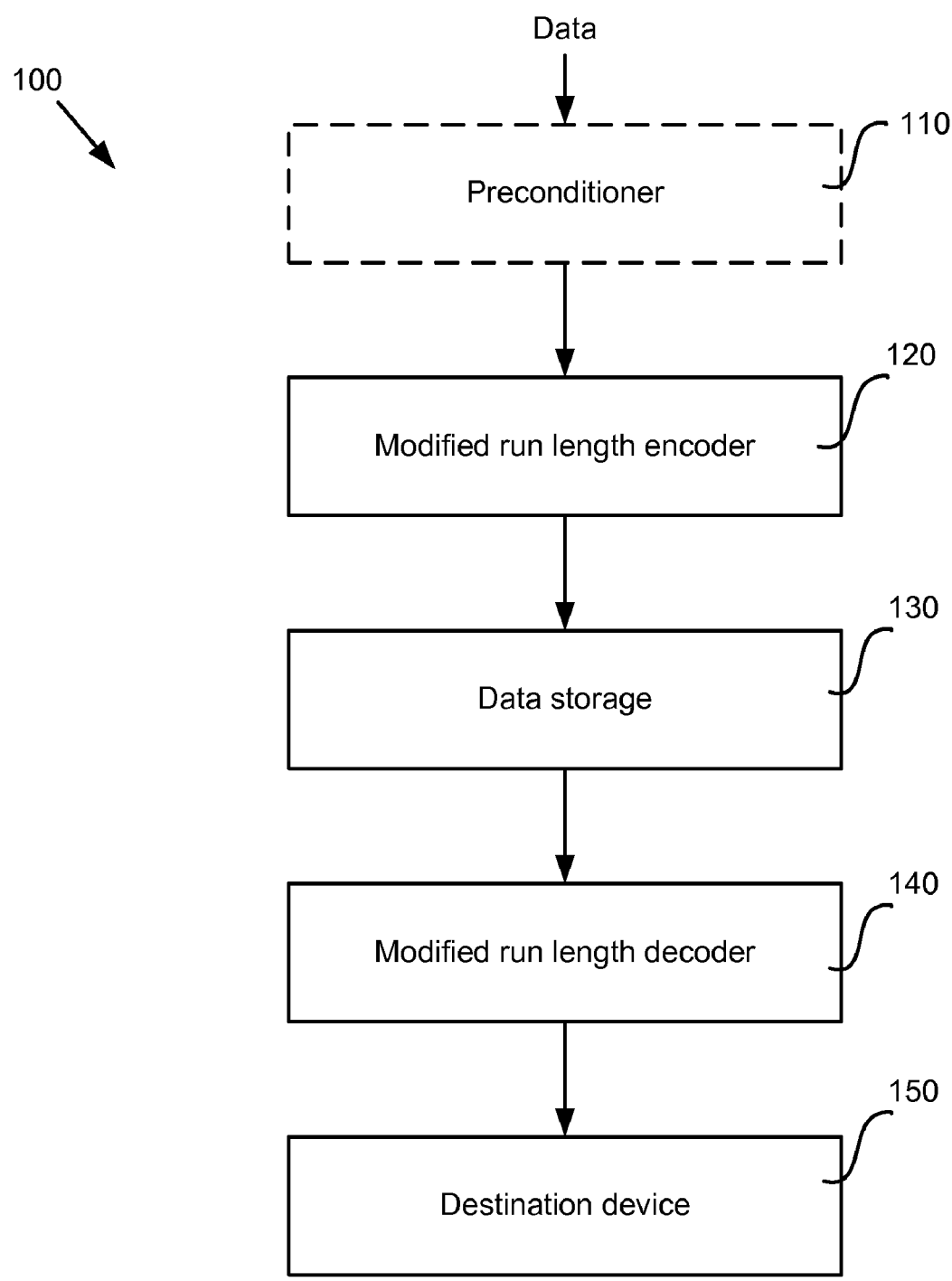
FIG. 1 conceptually illustrates a data compressing and decompressing system.

FIG. 1 illustrates a data compressing and decompressing system 100. System 100 may include an optional preconditioner 110, a modified run length encoder (MRLE) 120, a data storage 130, a modified run length decoder (MRLD) 140, and a destination device 150. Although illustrated as separate functional elements for ease of explanation, any or all of the elements of system 100 may be co-located and/or implemented by a common group of gates and/or transistors. In some implementations, some of elements 110-150 may be implemented by instructions executed by a general-purpose or specific-purpose processor. Further, any of elements 110-150 may be implemented via software, firmware, hardware, or any suitable combination thereof. The implementations are not limited in these contexts.

System 100 may receive data that may include, but is not limited to, video, audio, software, graphical information, television, movies, music, financial information, business information, entertainment information, communications, or any other data that may be suitably processed by system 100 and/or process 200. For ease of reference, the data input to system 100 may be referred to herein as video or graphical data, although it is not limited to such specific types of visual information.

Optional preconditioner 110 may, in some implementations, be present to precondition the data so that it includes more "runs" of data that may be encoded. For example, if the data includes an alpha channel (e.g., in graphics, a portion of a pixel's data that is reserved for transparency information), preconditioner 110 may substitute zeros for any data elements whose alpha values render then invisible. In this manner, preconditioner 110 may generate more runs in data input to MRLE 120 than would otherwise be present. Of course, such preconditioning may be desirable, or even feasible, in all implementations. In such implementations, optional preconditioner 110 may not be present in system 100, and the data may be directly input to MRLE 120.

MRLE 120 may be arranged to perform process 200 to selectively run length encode its input data. In some implementations, MRLE 120 may operate in real time (i.e., on a stream of data as it arrives), and may be implemented as logic circuitry for rapid operation. Although further details of its operation will be described with regard to process 200. MRLE 200 may be arranged so that it selectively encodes it input data to avoid any data expression. That is, if the size of the run length encoded data for certain data elements would meet or exceed the size of those data without encoding, MRLE 120 may pass the input data without alteration. In this manner, MRLE 120 may obtain the benefits of RLE data compression, while preventing expansion of the input data beyond its original size.

MRLE 120 may also be arranged to encode a "trigger" (e.g., the run-length or indicating part of a command pair, the other part being the value that repeatedly appears for the run length) within the range of possible values of the input data. MRLE 120 may accomplish this by reserving one input value as the "trigger value" and modifying any input data that happen to have the trigger value to another value (e.g., an adjacent or similar value). When reserving one of the input value as the trigger value (and changing data when this trigger value is encountered in the input data). MRLE 120 may introduce small errors in the compressed data, thereby preventing lossless compression.

Data storage 130 may be arranged to temporarily store elements of selectively compressed data from MRLE 120. Storage 130 may include, for example, semiconductor and/or magnetic storage, and may be rewriteable. In some implementations, storage 130 may include, for example, a frame buffer arranged to store an amount of video and/or graphics data before display. In such implementations, however, data storage 130 may be designed to be smaller than they would otherwise be for a given output resolution, due to the presence of MRLE 120. In such cases, the amount of power, chip area (size), and/or bandwidth saved by the smaller storage 130 may justify the inclusion of MRLE 120 and/or MRLD 140 in system 100.

Although some implementations of data storage 130 may include a physical storage device such as a frame buffer, in some implementations storage 130 may include, for example, a transmitter and receiver pair to remotely transfer the compressed data from MRLE 120 to MRLD 140 over a communication link (not shown). In such implementations, storage 130 may be conceptualized as storing the compressed data remotely (or temporarily via the transmission medium). In any event, storage 130 need not be limited to a local, physical storage device, such as a frame buffer.

MRLD 140 may be arranged to perform process 300 to selectively run length decode its input data. In some implementations, MRLD 140 may operate in real time (i.e., on a stream of data from storage 130 as it is sent to destination device 150), and may be implemented as logic circuitry for rapid operation. Although further details of its operation will be described with regard to process 300. MRLD 140 may be arranged so that it selectively decodes data by detecting the trigger value (and a run length within the trigger value) in the data. MRLD 140 may repeat the data value following the trigger value by the run-length to reproduce the same number of repeating elements that were encoded by MRLE 120. If the trigger value is not detected for an element (or elements) of input data. MRLD 140 may pass the input data without alteration. In this manner, MRLD 140 may selectively decompress the data encoded by MRLE 120.

Destination device 150 may include any consumer of the data in system 100 that would have come from storage 130. In the example above where storage 130 included a display buffer, destination device 150 may include a display device such as a monitor, television, integrated display, etc. In other implementations, however, destination device 150 need not necessarily be an output device, but rather may include one or more, possible intermediate, devices that operate on data from storage 130.

Figure 2:
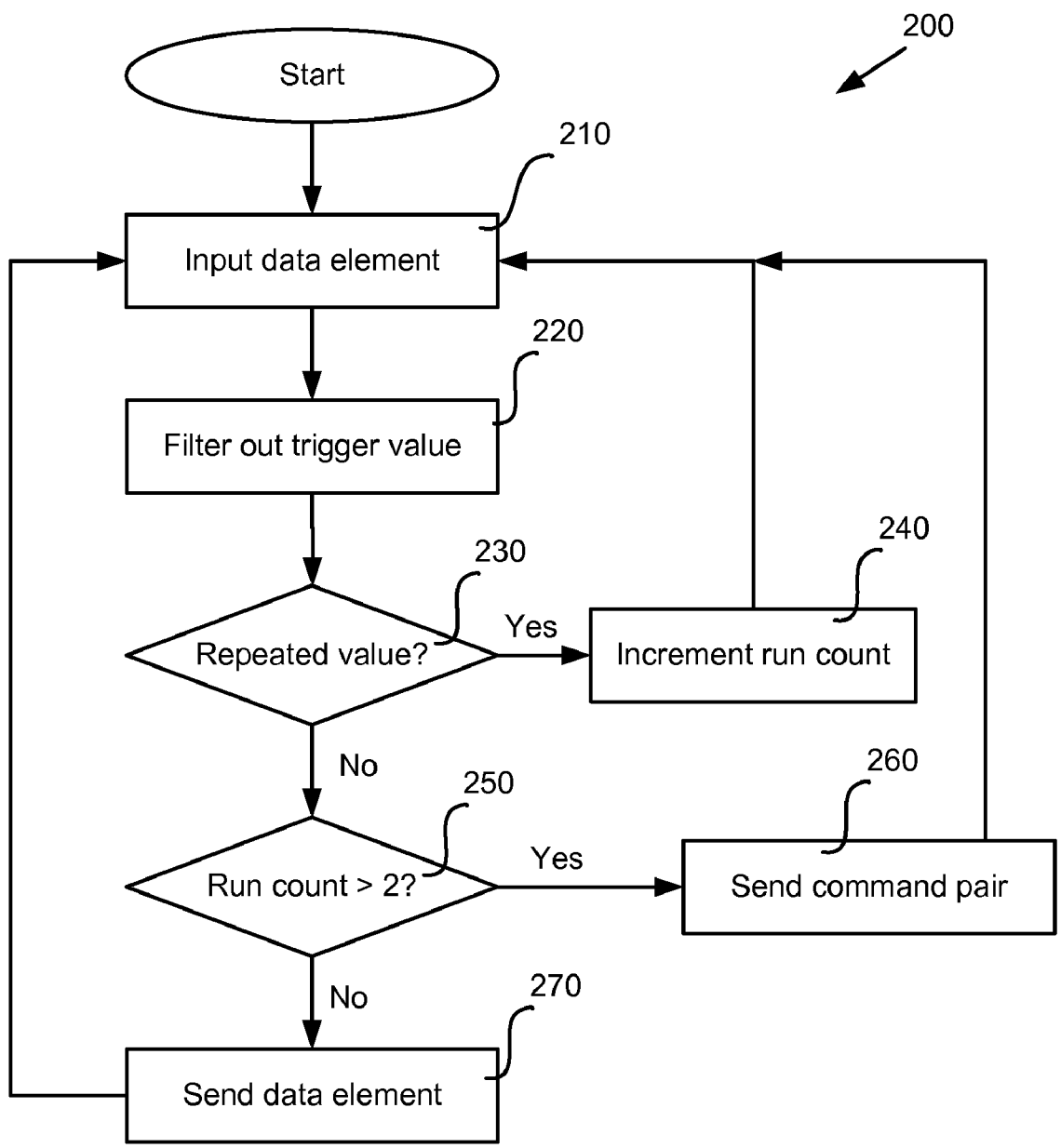
FIG. 2 illustrates a process of modified run length encoding.

FIG. 2 illustrates a process 200 of modified run length encoding that may be performed by MRLE 120. Although process 200 may be described with regard to system 100 and MRLE 120, it may be performed in other contexts and by other elements. Process 200 may begin with inputting a data element into MRLE 120 [act 210].

Processing may continue with MRLE 120 determining whether the data element contains a predefined trigger value, and if so, filtering it out by replacing the trigger value with another value [act 220]. One example of act 220 may be illustrated in luminance-chrominance (YUV) color space, where the trigger value may be chosen as a value for one of the color components that is rarely or never used (e.g., the FF (255 in hexadecimal) value for the V component). In act 220, MRLF 120 may remove all occurrences, if any, of FF for the V component that it encounters in order remove false triggers for MRLD 140. Also in act 220, MRLE 120 may replace this trigger value with a similar, and hopefully user-indistinguishable, value, such as FE (254 in hexadecimal) in the above example.

Suitable patterns in the input data for command triggers may differ for different data types and applications. Red-green-blue (RGB) data for graphics, for example, may use "near black" in the blue channel (which is virtually indistinguishable from black) as a trigger. Other suitable patterns for triggers in other types of data will be apparent.

Process 200 may continue with MRLE 120 determining if the current, possibly modified, data element is repeated from a previous data element [act 230]. If so, MRLE 120 may increment a run count [act 240] and return to act 210 for the next data element. For the first repeated element, the run count may be incremented from one to two. For the second repeated element, the run count may be incremented from two to three, and so on.

If act 230 encounters a data element that is not repeated, MRLE 120 may determine whether the current run count is greater than two for the previous data elements [act 250]. Regardless of whether the run count is greater than two or not in act 250, MRLE 120 may reset the run count to one in this act.

If the run count is greater than two, MRLE 120 may send a command pair that indicates a run-length-encoded value of length three or greater to storage 130 [act 260]. MRLE 120 may enocde any lengths of repeated data elements that are greater than two into a run length command followed by the run length data value (e.g., a command pair). In the above YUV example, the resulting command pair may have a format of (00,xx,FF) (YY,UU,VV), where the first, command term contains the FF trigger value and a run-length of xx (and possibly the most significant byte, shown here as 00, if needed) that indicates the number of times the following (YY,UU,VV) run length data value appeared in succession. For clarity, the YY term represents a hexadecimal luminance value ranging from 00 to FF, UU represents a chrominance value ranging from 00 to FF, and VV represents a chrominance value ranging from 00 to FF.

If the run count is not greater than two, MRLE 120 may send one or more data elements to storage 130 without encoding them into a command pair [act 270]. In the case where the run-length is one (e.g., the previous value was different), act 270 may send the input data element as-is to storage 130. When the run-length is two (e.g., only two same values in a row), act 270 may send both of these input data element to storage 130 without further processing. In either case, however, it should be noted that any triggers present in the data (e.g., FF in the above example) were removed in act 220 prior to act 270.

It is possible to set the threshold in act 250 to one, instead of two, but this would incur the additional encoding act 260 for the "only two same values" case without any corresponding reduction in the length of data sent to storage 130. That is, in either case two data elements would be sent in act 270—one encoded and one not. Thus, the threshold is ">2" in act 250 to avoid this additional computational overhead of act 260 for this boundary case of run length –2.

Process 200 will be further explained with regard to two numerical examples. In the first example, the following data elements: (Y,U,V) (16,45,67) (16,45,67) (16,45,67) (16,45,67) (16,45,67) (16,45,FF) (16,45,67) (16,45,67) may be compressed into the following data stream: (00,05,FF) (16,45,67) (16,45,FE) (16,45,67) (16,45,67).

The first five repeated values get converted, via acts 210-260, to a command pair: (00,05,FF) (16,45,67), which tells MRLD 140 to use the value (16,45,67) five times. The command is comprised of the 0×FF trigger with the run length in the most significant bits. The data value following the command, (16,45,67), is the value that gets repeated by MRLD 140. The sixth (16,45,FF) data value gets filtered in act 220 to remove the false trigger and ends up taking on the closest value: (16,45,FE). The remaining two values that follow would not benefit from compression and therefore remain unchanged by acts 250 and 270 as: (16,45,67) (16,45,67). Process 200 and MRLE 120 may compress the entire string of eight data elements into five data elements without any visually noticeable loss of data.

In the second example, the following data elements: (Y,U,V) (16,45,67) (16,45,68) (16,45,67) (16,45,68) (16,45, 67) (16,45,68) (16,45,67) (16,45,67) may not get compressed via process 200 and may remain the identical data stream: (16,45,67) (16,45,68) (16,45,67) (16,45,68) (16,45, 67) (16,45,68) (16,45,67) (16,45,67).

This second example includes a "worst case" value switch after every data element and would cause a typical RLE scheme to expand the data to 16 data elements. Faced with such "worst case" the typical RLE scheme would generate eight pairs of level and run length, effectively doubling the amount of data after processing. Process 200, by contrast, causes no expansion of the data via the operation of acts 210-230, 250, and 270.

Figure 3:
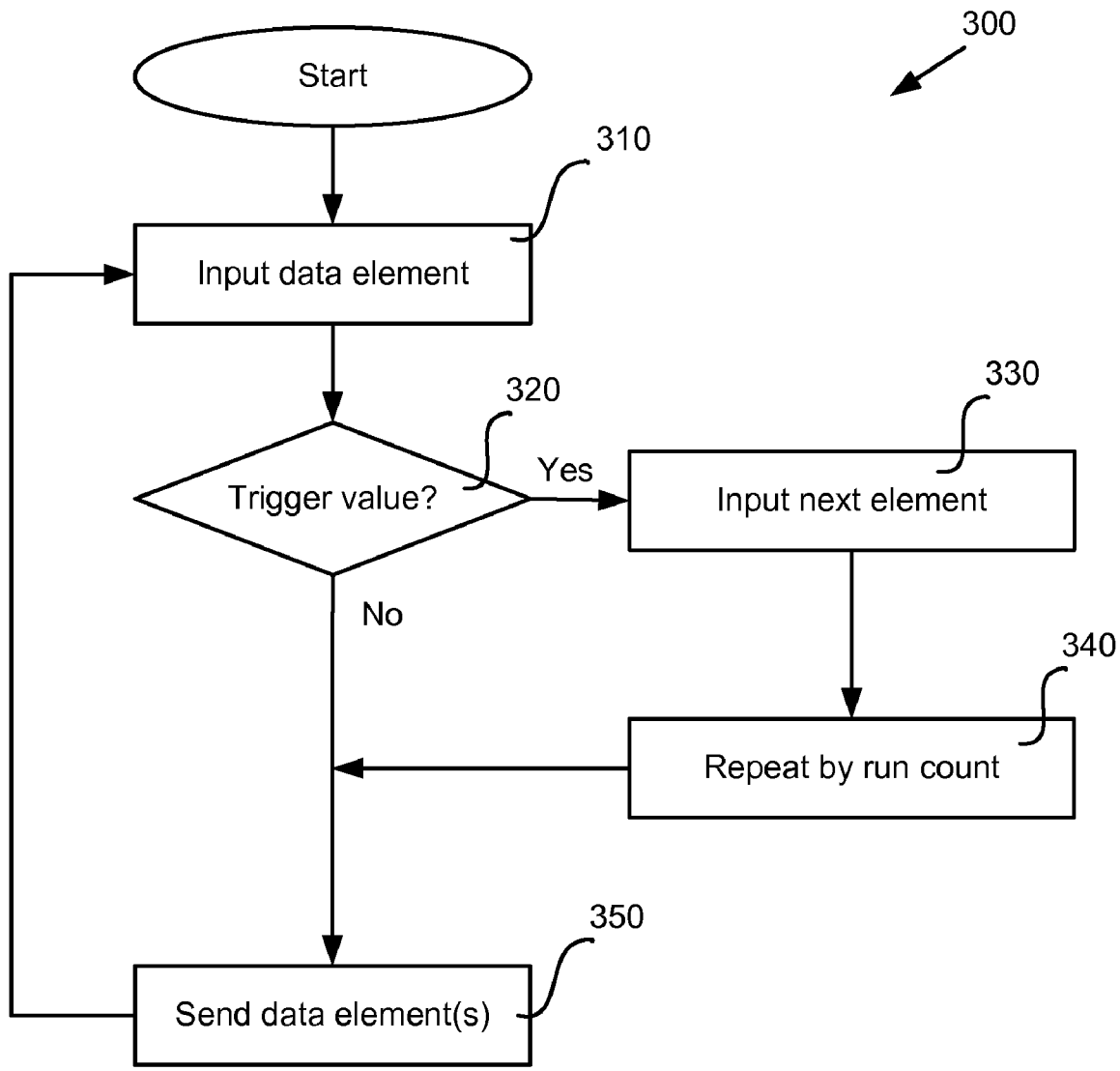
FIG. 3 illustrates a process of modified run length decoding.

FIG. 3 illustrates a process 300 of modified run length decoding that may be performed by MRLD 140. Although process 300 may be described with regard to system 100 and MRLD 140, it may be performed in other contexts and by other elements. Process 300 may begin with inputting a data element into MRLD 140 from storage 130 [act 310].

Processing may continue with MRLD 140 checking whether the data element includes the trigger value [act 320]. If the data element includes the trigger value (e.g., it is a run length command), MRLD 140 may input the next element [act 330] and repeat it to generate the total number of instances indicated in the run count portion of the run length command [act 340]. This run of like elements may be output by MRLD 140 to destination device 150 [act 350].

If in act 320 the trigger value is not present in the data element MRLD 140 may output it to destination device 150 without any decoding [act 350].

The foregoing description of one or more implementations provides illustration and description, but is not intended to be exhaustive or to limit the scope of the invention to the precise form disclosed. Modifications and variations are possible in light of the above teachings or may be acquired from practice of various implementations of the invention.

For example, although some implementations may include replacing otherwise valid data (e.g., a trigger value) with different data, resulting in lossy compression, in some implementations the data format may permit insertion of a trigger value without loss of data. In such implementations, for example when an unused field suitable for a trigger value exists within the data, lossless compression via RLE while avoiding data expansion may be achieved.

Further, at least some of the acts in FIGS. 2 and 3 may be implemented as instructions, or groups of instructions, implemented in a machine-readable medium.

No element, act, or instruction used in the description of the present application should be construed as critical or essential to the invention unless explicitly described as such. Also, as used herein, the article "a" is intended to include one or more items. Variations and modificatinos may be made to the above-described implementation(s) of the claimed invention without departing substantially from the spirit and principles of the invention. All such modifications and variations are intended to be included herein within the scope of this disclosure and protected by the following claims.

What is claimed is:

1. A method of selectively run length encoding data, comprising:
removing a value from one or more data elements if the value is present in the one or more data elements and if the value corresponds to a trigger value;
calculating a run length of the one or more data elements;
encoding the one or more data elements as a command pair when the run length is greater than two, the command pair including the trigger value; and
outputting the one or more data elements without encoding the one or more data elements when the run length is not greater than two.

2. The method of claim 1, wherein the removing includes:
replacing the value in the one or more data elements with a similar but different substitute value.

3. The method of claim 2, wherein the substitute value is an adjacent value to the trigger value.

4. The method of claim 1, wherein the calculating includes:
determining if a current data element is identical to a previous element, and incrementing a run length if the current data element is identical to a previous element.

5. The method of claim 1, wherein the command pair includes:
a command element including the trigger value and the run length, and
another element including a data level of the one or more data elements.

6. The method of claim 1, wherein the encoding includes:
outputting the command pair.

7. The method of claim 1, wherein the one or more data elements include pixels of video data or graphical data in a YUV color space or an RGB color space.

8. The method of claim 1, further comprising:
storing the command pair or the outputted one or more data elements.

9. The method of claim 1, further comprising:
repeating the removing, the calculating, the encoding, and the outputting for all data elements in a stream of data.

10. A system, comprising:
a modified run length encoder to produce encoded data from input data and arranged to:
replace any values that correspond to a trigger value found in the input data with substitute values to produce modified data, and
selectively run length encode the modified data or not encode the modified data based on a run length of the modified data to prevent expansion of the encoded data relative to the modified data:
a storage device to store the encoded data; and
a modified run length decoder to selectively run length decode the encoded data or not decode the encoded data based on trigger values in the encoded data to produce decoded data.

11. The system of claim 10, wherein the modified run length encoder is further arranged in run length encode the modified data when the run length is greater than two and not run length encode the modified data when the run length is not greater than two.

12. The system of claim 10, wherein the modified run length encoder is further arranged to insert the trigger value and the run length in a command value when it run length encodes the modified data.

13. The system of claim 10, wherein the input data include pixels of video or graphical data, and
wherein the substitute values are visually indistinguishable fore the trigger values.

14. The system of claim 13, wherein storage device includes a frame buffer.

15. The system of claim 13, further comprising:
a display device to display the decoded data.

16. The system of claim 10, further comprising:
a preconditioner to produce the input data by conditioning data so that higher run lengths exist in the input data.

17. A method of storing color data, comprising:
replacing any occurrences of a values that correspond to a trigger value in the color data with a visually similar substitute value;
run length encoding the color data to produce encoded output data when a run length of the color data is greater than two, the encoded output data including the trigger value;
outputting the color data without modification as unencoded output data when the run length is not greater than two; and
storing the encoded output data and the unencoded output data in a frame buffer.

18. The method of claim 17, wherein the encoded output data includes:
a command element including the trigger value and the run length, and
another element including a value of the color data.

19. The method of claim 17, further comprising:
run length decoding data from the frame buffer as destination data when the trigger value is detected; and
outputting the data from the frame buffer without modification as the destination data when the trigger value is not detected.

20. The method of claim 19, further comprising:
displaying the destination data.

* * * * *